United States Patent
Donhauser et al.

(10) Patent No.: US 10,854,421 B2
(45) Date of Patent: Dec. 1, 2020

(54) CHARGED PARTICLE BEAM SYSTEM AND METHOD

(71) Applicants: Carl Zeiss Microscopy GmbH, Jena (DE); Carl Zeiss Microscopy Ltd., Cambridge (GB)

(72) Inventors: Daniela Donhauser, Ulm (DE); Christian Mueller, Aalen (DE); Barry Chamley, Mildenhall (GB); Tobias Volkenandt, Oberkochen (DE); Dirk Preikszas, Oberkochen (DE); Giuseppe Pavia, Aalen (DE); Heiko Stegmann, Dresden (DE)

(73) Assignees: Carl Zeiss Microscopy GmbH, Jena (DE); Carl Zeiss Microscopy Ltd., Cambridge (GB)

( * ) Notice: Subject to any disclaimer, the term of this patent is extended or adjusted under 35 U.S.C. 154(b) by 0 days.

(21) Appl. No.: 16/429,315

(22) Filed: Jun. 3, 2019

(65) Prior Publication Data
US 2019/0304743 A1   Oct. 3, 2019

Related U.S. Application Data

(63) Continuation of application No. PCT/EP2018/053191, filed on Feb. 8, 2018.

(30) Foreign Application Priority Data

Feb. 14, 2017   (DE) .................. 10 2017 202 339

(51) Int. Cl.
*H01J 37/304*   (2006.01)
*H01J 37/08*   (2006.01)
*H01J 37/317*   (2006.01)

(52) U.S. Cl.
CPC ............ *H01J 37/304* (2013.01); *H01J 37/08* (2013.01); *H01J 37/317* (2013.01);
(Continued)

(58) Field of Classification Search
CPC .... H01J 37/30; H01J 37/3002; H01J 37/3007; H01J 37/302; H01J 37/3023; H01J 37/304
(Continued)

(56) References Cited

U.S. PATENT DOCUMENTS 6,472,881 B1   10/2002 Sugiyama et al.
10,249,471 B2   4/2019 Agemura
(Continued)

FOREIGN PATENT DOCUMENTS

DE   11 2014 007 204 T5   8/2017
JP   2010-129253 A   6/2010

OTHER PUBLICATIONS

German Office Action, with translation thereof, for corresponding Appl No. 10 201 202 339.2, dated Oct. 30, 2017.
(Continued)

*Primary Examiner* — Jason L McCormack
(74) *Attorney, Agent, or Firm* — Fish & Richardson P.C.

(57) ABSTRACT

A charged particle beam system includes a charged particle source, an extraction electrode, a suppressor electrode, a first variable voltage supply for biasing the extraction electrode with an extraction voltage and a second variable voltage supply for biasing the suppressor electrode with a suppressor voltage.

24 Claims, 7 Drawing Sheets

(52) U.S. Cl.
CPC . *H01J 2237/063* (2013.01); *H01J 2237/0653* (2013.01); *H01J 2237/083* (2013.01); *H01J 2237/0805* (2013.01); *H01J 2237/24564* (2013.01); *H01J 2237/30472* (2013.01); *H01J 2237/31749* (2013.01)

(58) Field of Classification Search
USPC ............................. 250/492.1, 492.2, 492.3
See application file for complete search history.

(56) References Cited

U.S. PATENT DOCUMENTS

| | | |
|---|---|---|
| 2005/0062480 A1 | 3/2005 | Pearl |
| 2007/0158588 A1* | 7/2007 | Zhou ..................... H01J 37/073 250/492.2 |
| 2013/0032714 A1 | 2/2013 | Kitayama |
| 2016/0141147 A1 | 5/2016 | Brogden |
| 2017/0122852 A1 | 5/2017 | Uemoto et al. |

OTHER PUBLICATIONS

The International Search Report and Written Opinion for the corresponding PCT Application No. PCT/EP2018/053191, dated Jul. 2, 2018.

* cited by examiner

During milling run:
☒ Allow auto heat
☐ Allow auto extractor readjust
Max. allowed extractor change for continuing run after auto extractor readjust $\boxed{100}$ V
Heat (if activated) or pause run if emission current <= $\boxed{1,8}$ µA or >= $\boxed{2,2}$ µA
If upper suppressor limit (2kV) is reached wait for $\boxed{0.5}$ h until a heat is done (if activated)

Fig. 2

No milling run:
☐ Allow auto extractor readjust
☒ Warning if suppressor is close to its limits
Lower suppressor limit for heating warning $\boxed{150}$ V
Upper suppressor limit for heating warning $\boxed{1900}$ V
☒ Warning if emission is out of range FIB Emission Target: $\boxed{2}$ µA
Go to standby at $\boxed{3}$ µA Emission Current
$\boxed{\text{Load Default Parameters}}$

Fig. 3

Turn on source
☒ Allow auto heat
☒ Allow auto extractor readjust

Fig. 4

CHARGED PARTICLE BEAM SYSTEM AND METHOD

CROSS-REFERENCE TO RELATED APPLICATION

The present application is a continuation of, and claims benefit under 35 USC 120 to, international application PCT/EP2018/0531981, filed Feb. 8, 2018, which claims benefit under 35 USC 119 of German Application No. 10 2017 202 339.2, filed Feb. 14, 2017. The entire disclosure of these applications are incorporated by reference herein.

FIELD

The present disclosure relates to a charged particle beam system and a method for processing a sample with such charged particle beam system. More particular the present disclosure relates to an ion beam system, even more particular to an ion beam system with a liquid metal ion source, such as a Gallium focused ion beam (FIB), and a method of sample processing with a focused ion beam, even more particular with a focused liquid metal ion beam.

BACKGROUND

Focused ion beam systems generally are well known. The ion beam of such ion beam systems are used to process samples with high resolution, for example to prepare so called cross-sections through samples by ion beam sputtering or ion beam induced chemical etching to get a view onto a surface in the sample which otherwise could not be accessed by an electron beam or ion beam. In addition ion beams are used to generate high resolution imaging data from three-dimensional volumes. The processing time for such sample processing tasks can become very long, up to several days. On the other hand, the long term stability of the ion emission of the ion source sometimes is not sufficient to successfully carry out such tasks. One particular reason is that the tip of the ion source can become contaminated, and the ion emission current then can change or even break down completely.

SUMMARY

The present disclosure seeks to provide a charged particle beam system which is capable of providing long-term runs and that is therefore suited for long term sample processing operations. The disclosure also seeks to provide a process by which a long-term sample processing is possible.

According to a first aspect the disclosure, a method is provided for automated long-term processing of a sample by a charged particle beam generated by a charged particle source. The charged particle source has a tip emitting charged particles, an extraction electrode and a suppressor electrode, a first variable voltage supply for biasing the extraction electrode with an extraction voltage and a second variable voltage supply for biasing the suppressor electrode with a suppressor voltage. The method conducted with such charged particle beam system includes the steps:
 a) processing the sample by scanning a focused charged particle beam across the surface of the sample, the focused charged particle beam having an emission current;
 b) while processing the sample, measuring the emission current and the suppressor voltage;
 c) automatically adjusting the suppressor voltage within a first predefined range to maintain the emission current within a predefined second range;
 d) automatically interrupting the processing of the sample if the beam current gets out of the second range because the suppressor voltage is close to a limit of the first range;
 e) automatically carrying-out a source recovery process; and
 f) automatically continuing the processing of the sample after carrying-out the source recovery process.

In an embodiment the charged particle source is an ion source the beam current is an ion beam current and the source recovery process is an ion source recovery process. In an alternative embodiment the charged particle beam source can be an electron source, especially a cold field emission electron source. In this latter case the source recovery process is an electron source recovery process and the beam current is an emission current of the electron source.

In an advantageous embodiment the source recovery process includes a heating process and the method can further include the steps of counting the number of heating processes conducted within a predefined second time period, and carrying-out the heating process in step e) only if the number of heating processes carried-out within the second time period is smaller than or equal to a predefined number. In this way it can be prevented that the tip becomes heated too often to ensure that the ion source does not become damaged and is protected from over-heating, which can result in premature loss of the liquid metal and shortened source lifetime.

The embodiment can further include adjusting the extraction voltage if the number of heating processes carried-out in the second time period is larger than the predefined number. In this case, in addition to adjusting the extraction voltage, a further heating process can be carried-out if the time period elapsed since the last heating process was carried-out is larger than a predefined first time period.

In a further embodiment the source recovery process can include, additionally to the heating process, automatically changing the extraction voltage.

In a further embodiment the ion source recovery process can include changing the extraction voltage, and determining an amount of change of the extraction voltage, and automatically realign a focus of the ion beam and/or a current of the ion beam on a surface of a sample if the amount of change of the extraction voltage is larger than a third predefined voltage value. The realignment of the current of the ion beam can be performed via the beam limiting aperture and/or the condenser electrode.

In an advantageous embodiment the method can further include determining an amount of change of the extraction voltage, and automatically continuing the processing of the sample if the amount of change of the extraction voltage is smaller than a third predefined voltage value.

According to another aspect the disclosure refers to a charged particle beam system including a charged particle emitting tip, an extraction electrode, a suppressor electrode, a first variable voltage supply for biasing the extraction electrode with an extraction voltage, a second variable voltage supply for biasing the suppressor electrode with a suppressor voltage, and a control operatively connected to the various other components of the charged particle beam system. The control can be configured to process a sample by scanning a focused charged particle beam emitted by the tip emitting charged particles across the surface of the sample. The charged particle source can provide an emission current and the beam current which is a fraction of the emission current. The control can be further configured to measure the emission current and the suppressor voltage while processing the sample, to automatically adjust the suppressor voltage within a first predefined range to maintain the emission current within a second predefined range, to automatically interrupt the processing of the sample if the emission current gets out of the second predefined range because the suppressor voltage is close to a limit of the first predefined range;

to automatically carry out a source recovery process; and to automatically continue the processing of the sample after carrying-out the source recovery process.

In an embodiment the charged particle source is an ion source the beam current is an ion beam current and the source recovery process is an ion source recovery process. In an alternative embodiment the charged particle beam source can be an electron source, especially a cold field emission electron source. In this latter case the source recovery process is an electron source recovery process and the emission current is an ion emission current of the electron source.

In an advantageous embodiment the source recovery process includes a heating process and the control is further configured to count the number of heating processes conducted within a predefined second time period, and carrying out the heating process if the number of heating processes carried-out within the second time period is smaller than a predefined number. In this way it can be prevented that the tip becomes heated too often to ensure that the charged particle source does not become damaged and is protected from over-heating, which can result in premature loss of the liquid metal and shortened source lifetime.

In the embodiment the control can be further configured to adjust the extraction voltage if the number of heating processes carried out in the second time period is larger than or equal to the predetermined number. In this case, in addition to adjusting the extraction voltage, the control can be further configured to initiate a further heating process if the time period elapsed since the last heating process was carried out is larger than a predefined first time period.

In a further embodiment the control can be configured, additionally to the heating process, to automatically change the extraction voltage if the number of heating processes carried-out within the second time period is smaller than the predefined number.

In a further advantageous embodiment the control is further configured to determine an amount of change of the extraction voltage, and to automatically continue the processing of the sample if the amount of change of the extraction voltage is smaller than a third predefined voltage value.

In another advantageous embodiment the control can be further configured to receive commands relating to an application from a client, to automatically switch into a fully automated mode while the application is running and to automatically switch back into a semi-automated mode when the application has been completed. In such embodiment the control can be further configured to carry out the source recovery process automatically in the fully automated mode, as well as in the semi-automated mode.

The charged particle beam system can include a user interface via which a user of the charged particle beam system can select the second predefined range and/or the third predefined voltage value.

In a further embodiment the user interface can be configured to select between a fully automated mode and a semi-automated mode. In such embodiment the control can be further configured to carry-out the source recovery process in the fully automated mode, as well as in the semi-automated mode.

In another advantageous embodiment the control can be further configured to interrupt the processing of the sample for a predefined third time period before the source recovery process is started. The user interface is further configured to select the third predefined time period. In such embodiment the control can be configured to determine during the third time period whether the emission current gets back into the second predefined range with the suppressor voltage within the first predefined range again, and to continue the processing without carrying out a source recovery process, e.g. a heating process if the emission current is identified to be within the second predefined range and the suppressor voltage is identified to be within the first predefined range during the third time period.

Generally speaking, the concept of the present disclosure is directed to automatic workflows for emission recovery of charged particle beam sources, such as cold field emission electron sources or ion sources, e.g. Ga-liquid metal ion sources, by heating and/or readjusting the extractor voltage in different situations, i.e. for turning on the source, source management during an automated processing run and when no automated run is ongoing. There is the need to be able to perform long term charged particle beam processing or ion FIB milling operations such as 3D EDS or other 3D tomography analysis without manual intervention. Such long term processing runs can be limited by the charged particle emitter entering a state where it can no longer give stable emission. This can have different reasons, e.g. the suppressor voltage which is regulating the emission current is at its limits or also emission instabilities can occur. Therefore, mechanisms are provided to automatically detect and handle such occurrences without user interventions.

Besides the automatic handling during a long-term run there is also a need to give the user some guidance on how to treat the source properly, because otherwise the user needs to have a quite extensive knowledge on how to handle ion sources. Therefore, there is, besides the fully automated operation, an automated or semi-automated source management provided when the source is turned on respectively when it is emitting but no automated run is ongoing.

BRIEF DESCRIPTION OF THE DRAWINGS

More details of the disclosed disclosure are described with reference to the attached drawings.

FIG. 2 shows an example of a user interface for user settings for a fully automated mode.

FIG. 3 shows an example of a user interface for user settings of a semi-automated mode.

FIG. 4 shows an example of a user interface for user settings for a source turn-on.

FIG. 7 shows a functional diagram for a source turn-on.

DESCRIPTION OF EXEMPLARY EMBODIMENTS

Figure 1:
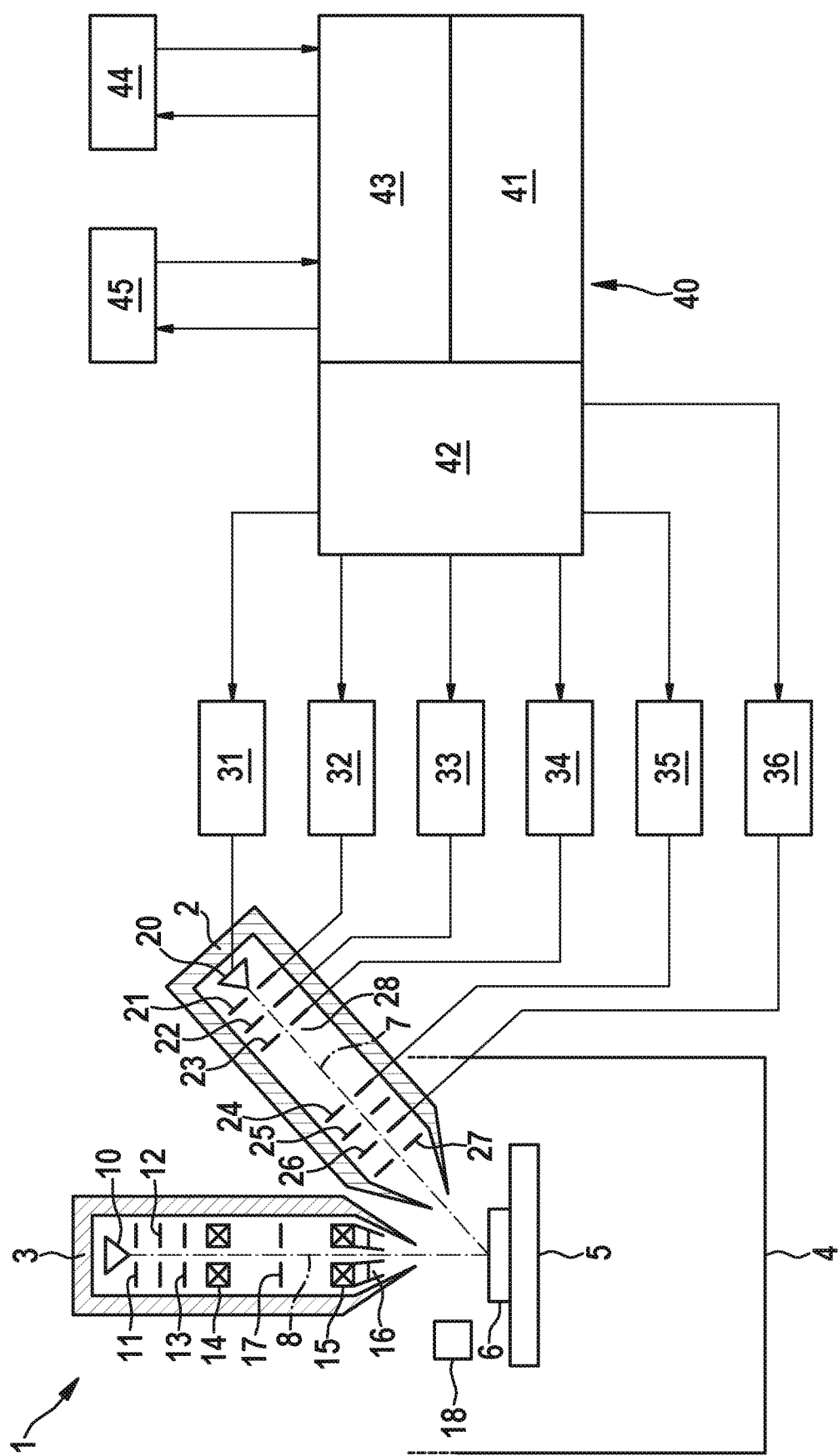
FIG. 1 shows a schematic of a combined ion beam and electron beam system.

The charged particle beam system 1 shown in FIG. 1 can be configured in the form of a so called FIB-SEM system including an ion beam tube 2 and an electron beam tube 3.

The ion beam tube 2 and the electron beam tube 3 are both attached to a sample chamber 4 which can be configured as a vacuum chamber. Within the sample chamber a sample stage 5 is arranged in a manner that a sample 6 positioned on the sample stage can be moved in several directions, advantageously in three perpendicular directions as well as rotated around two rotational axes. The ion beam tube 2 and the electron beam tube 3 are arranged at an angle with respect to another so that an optical axis 7 of the ion beam tube 2 and an optical axis 8 of the electron beam tube intersect at a particular point within the sample chamber 4. Ideally, the surface of a sample which is to be processed is positioned in this point of intersection of the optical axes 8, 7 of the electron beam tube 3 and the ion beam tube 2.

The electron beam tube includes an electron source 10, several electrodes 11, 12, 13 for forming and accelerating electrons emitted by the electron source, a condenser lens 14, an objective lens 15 and a beam scanning deflector 16.

The electron source 10 can be a cold field emission source or a thermal field emission source. In these cases the electrode 11 closest to the electron source is a suppressor electrode, the next electrode 12 following in the direction of an electron beam emitted by the electron source is an extraction electrode and the further electrode 13 is an anode or beam accelerating electrode. However, the electron source 10 also can be thermal electron emitter.

The condenser lens 14 can be a magnetic lens. The objective lens 16 can be a magnetic lens or a combination of a magnetic lens and an electrostatic lens. In the latter case the electrostatic portion of the objective lens 15 can be configured in the form of a so called electrostatic immersion lens by which the electrons in the electron beam emitted by the electron emitter 10 and focused by the objective lens 15 onto the surface of a sample 6 are decelerated to the final beam energy before impinging onto the sample 6.

The electron beam column 3 further includes adjustable high-voltage supplies (not shown) which provide high-voltages by which the electron emitter 10 as well as the electrodes 11, 12, 13 are biased. In addition, the electron beam column 3 further includes adjustable current supplies (not shown) which provide electrical currents for the condenser lens 14 and the magnetic coil of the objective lens 15.

The electron beam column 3 can further include a detector 17 by which interaction products leaving the sample due to impinging electrons can be detected. Respective interaction products especially can be secondary electrons or backscattered electrons. A further detector 18 also can be arranged within the sample chamber 4. This further detector can be configured to detect electrons, too, but also can be configured to detect light or ions.

An electron beam column as described above is typically used to record images of the surface of the sample. For this task the electron beam is scanned across the surface of the sample along a two-dimensional pattern by applying different currents or voltages to the scanning deflector 16. At each position of the electron beam detection signals of either the detector 17 within the electron beam column 3 or the detector 18 arranged within the sample chamber 4 are recorded. Afterwards the detection signals corresponding to each position of the electron beam on the surface of the sample are compiled together to represent an image of the surface of the sample based on the detected interaction products.

The ion beam column 2 generally has a configuration analogous to the configuration of the electron beam column as described before. The ion beam column 2 includes an ion source with an ion emitting tip 20, a suppressor electrode 21 next to the ion emitting tip 20, an extraction electrode 21 and an electrode 23 forming a condenser lens. A further electrode 28 downstream of the condenser electrode 23 the ion beam column 2 can be grounded.

The ion beam column 2 further includes a beam deflector electrode system 24 and several electrodes 25, 26, 27 forming an objective lens by applying suitable voltages to these electrodes 25, 26, 27. In a particular embodiment also the outer two electrodes 25, 27 of the objective lens are grounded. However, the region between electrode 28 and the last electrode of the objective lens also can be biased with a different common electrical potential to increase or decrease the energy of the ions within the ion beam column 2.

The ion beam column further includes several variable voltage sources 31-36. A first high-voltage source 33 is connected to the extraction electrode 22 and is configured to bias the extraction electrode 22 with a first high-voltage (extraction voltage) with reference to the emitter tip voltage. A second high-voltage source 32 is connected to the suppressor electrode 21 and is configured to bias the suppressor electrode 21 with a second high-voltage (suppressor voltage) with reference to the emitter tip voltage. A third high-voltage source 31 is connected to the emitter tip 20 and is configured to bias the emitter tip 20 with a third high-voltage. The voltage difference between the emitter tip and the sample 6 defines the landing energy of the ions in the ion beam when impinging onto the sample.

A fourth high-voltage source 34 is connected to electrode 23 which forms a condenser lens and is configured to bias the electrode 23 with a fourth high-voltage. The voltage difference between the grounded electrode 28 and the emitter tip 20 defines the ion beam energy within the (grounded) ion beam column.

A fifth voltage source system 35 is connected to the deflector electrode system 24 and is configured to bias the deflector electrode system 24 with fifth voltages. These fifth voltages can be changed within short times to scan the ion beam across the surface of the sample 6. This fifth voltage source system typically only provides adjustable voltages in the range up to about 100 volts.

A sixth high-voltage source 36 is connected to at least one of the electrodes 26, 27, 28 of the objective lens and is configured to bias at least one of the electrodes forming the objective lens with a sixth high-voltage. In a particular embodiment only the middle electrode 26 of the electrodes defining the objective lens of the ion beam column is supplied with a variable voltage, whereas the two other electrodes 25, 27 surrounding the middle electrode are electrically connected to the grounded electrode 28 and, accordingly are at the same potential as the grounded electrode 28.

When operating the ion beam column the extraction electrode 22 is strongly biased with a negative high-voltage relative to the emitter tip 20. By the strong electrical field in the immediate vicinity of the emitter tip atoms of the liquid metal are ionized, and are accelerated into the direction of the extraction electrode 22. These ions, forming an ion beam which is further condensed by the voltage of electrode 23, and are focused by the action of the objective lens 25, 26, 27 onto the surface of the sample 6. By supplying different voltages to the suppressor electrode 21 the emission current (herein also called ion current) and the ion beam current can be varied. The position at which the ion beam impinges onto the surface of the sample can be changed by supplying different electrical voltages to the deflector electrode system 24.

The ion column can include several additional components which are not shown in FIG. 1. For example the column in addition can include several apertures to adjust the probe current on the surface of the sample. In addition the ion column can include additional beam blanking electrodes which can be biased with an additional electrical voltage to deflect the ion beam onto a massive portion of a diaphragm to avoid that the ion beam reaches the sample 6 and to measure the probe current.

The ion beam column especially can be configured as a liquid metal ion beam column. In this case the ion emitting tip includes a small reservoir of a liquid metal, such as Gallium. A small portion of the liquid metal becomes ionized, as described above, in the vicinity of the ion emitting tip 20.

While the electron beam column typically is used to record images of the surface of the sample the ion beam typically is used for sample processing, i.e. to remove material from the sample either due to ion beam sputtering or due to ion beam induced chemical etching. In the latter case the ion beam system in addition can include a gas supply system (not shown) for supplying a suitable process gas to the surface of the sample 6. A process gas supplied to the sample by a gas supply system also can be used for ion beam induced deposition of material on the surface of the sample 6.

It should be noted that the present disclosure is not restricted to FIB-SEM systems as described above. An embodiment of the disclosure also can only provide a single charged particle beam column, i.e. only the ion beam column. In this case images of the sample surface can be recorded by scanning the ion beam across the surface of the sample in a two-dimensional pattern, recording the signal detected by the detector 18 arranged within the sample chamber 4 at each position of the ion beam and compiling images based on the position data for the ion beam and the detector signals. However the advantage of a FIB-SEM system as shown in FIG. 1 compared to a single beam system only including an ion beam column is the higher resolution which is achievable with electron beam columns compared to ion beam columns. An alternative embodiment of the disclosure also can include more than two charged particle columns, such as three columns, for example a first column with a gas field ion source, a second column with an electron source and a third column with a liquid metal ion source.

The ion beam system in FIG. 1 further includes a control 40 configured to control the operation of the ion beam column 2 by controlling the appropriate voltages supplied by the high-voltage sources 31-36. The control can be configured by several control units such as a FIB Control 42 configured to generally control the operation of the ion beam column 2, a Scan Control 41 to control the scanning of the ion beam and the recording of an image, and a FIB Recovery-Control 43 to control the recovery process of the ion emission tip. Each of the control units 41, 42, 43 can be realized by particular individual hardware or by software modules running on a common computer. If each of the control units 41, 42, 43 includes individual hardware components data exchange and communication between these control units is desirable.

The control 40 further includes a user interface 45, for example a graphical user interface (GUI), via which a user of the ion beam system can input particular system settings.

The control 40 is configured to receive commands relating to an application from a client 44 and to communicate with the client. In addition the control 40 is configured to measure the ion current and the suppressor voltage, to adjust the suppressor voltage, to adjust the extractor voltage, to interrupt the processing of the sample, to conduct tip recovery processes including a heating process, to measure time periods lapsed since heating processes have been performed and to count the number of heating processes conducted within a predefined second time period. The control is further configured to automatically switch into a fully automated mode while an application defined by the client is running and to automatically switch into a semi-automated mode when the application has been completed. The control 40 is further configured to adjust the extraction voltage.

As shown in FIGS. 2 to 4, the user of the ion beam system can input via the user interface 45 various parameters and settings for the fully automated mode, the semi-automated mode and the turning-on process of ion beam column.

As shown in FIG. 2 the user can select for the fully automated mode whether the FIB Recovery Control 43 shall conduct an automated ion source heating process if it turns out to become desirable because the ion current gets out of the second predefined range. In a similar manner the user can select whether the FIB Recovery Control 43 shall readjust the voltage supplied to the extractor electrode 22 if this turns out to become desirable. In addition, the user can define a voltage difference by which the extractor is allowed to become increased or decreased without automatically interrupting the run for the sample processing. In addition, the user can define a waiting time for which the processing of the sample shall be interrupted at maximum. If during this waiting time the ion current reenters the second predefined range the run is continued. If during this waiting time the ion current exceeds a critical value the ion source recovery process is started immediately. The process conducted by the FIB Recovery Control 43 based on these settings will be described in more detail with reference to FIG. 5.

As mentioned above, the fully automated mode can be selected automatically if the processing of the sample by the ion beam system is controlled by a client 44. Alternatively, in an additional embodiment, the user interface can include an additional selector input via which the user can manually select either the fully automated mode or the semi-automated mode irrespective of whether the processing is controlled by a client application or manually by the user himself.

In the semi-automated mode (FIG. 3) the user can select whether the FIB Recovery Control 43 shall automatically readjust the voltage supplied to the extractor electrode 22 if the heating process fails. In addition, the user can define whether the FIB Recovery Control 43 shall provide a specific warning signal if the voltage supplied to the suppressor electrode 21 is close to the limits of the allowed or possible range, and at which lower and upper values of the voltage supplied to the suppressor electrode 21 such warning signals are generated, and whether the FIB Recovery Control 43 has to generate another specific warning if the ion current runs out of the second predefined range. The process conducted by the FIB Recovery Control 43 in the semi-automated mode will be described in more detail with reference to FIG. 6.

In an additional subfield the user can define a target value for the ion current as well as a maximum value for the ion current at which the FIB Recovery Control has to automatically switch the ion source into a stand-by mode. In this field for parameter settings the user also can select to have the FIB Recovery Control 43 load and work with default parameters for the target value of the ion current and the maximum value for the ion current and a couple of other operating parameters. The settings in this sub-field will be applied in the fully automated mode, in the semi-automated mode as well as for the source turn on.

In a further field (see FIG. 4) of the user interface 45 the user can define particular settings for turning-on the ion source. Especially the user can select whether an automatic heating process shall be started and whether an automated change of the voltage applied to the extractor electrode 22 will be carried out by the FIB Recovery Control 43 if the turning-on is unsuccessful otherwise. The process conducted by the FIB Recovery Control 43 based on these settings will be described in more detail with reference to FIG. 7.

It should be noted that with the term "ion current" the emission current of the ion source is meant. A good measure for this emission current can be the current between the extractor electrode and the emitter tip because about 90% of the ions emitted by the emitter tip impinge onto the extractor electrode and only a minor portion thereof passes the hole in the extractor electrode.

Figure 5:
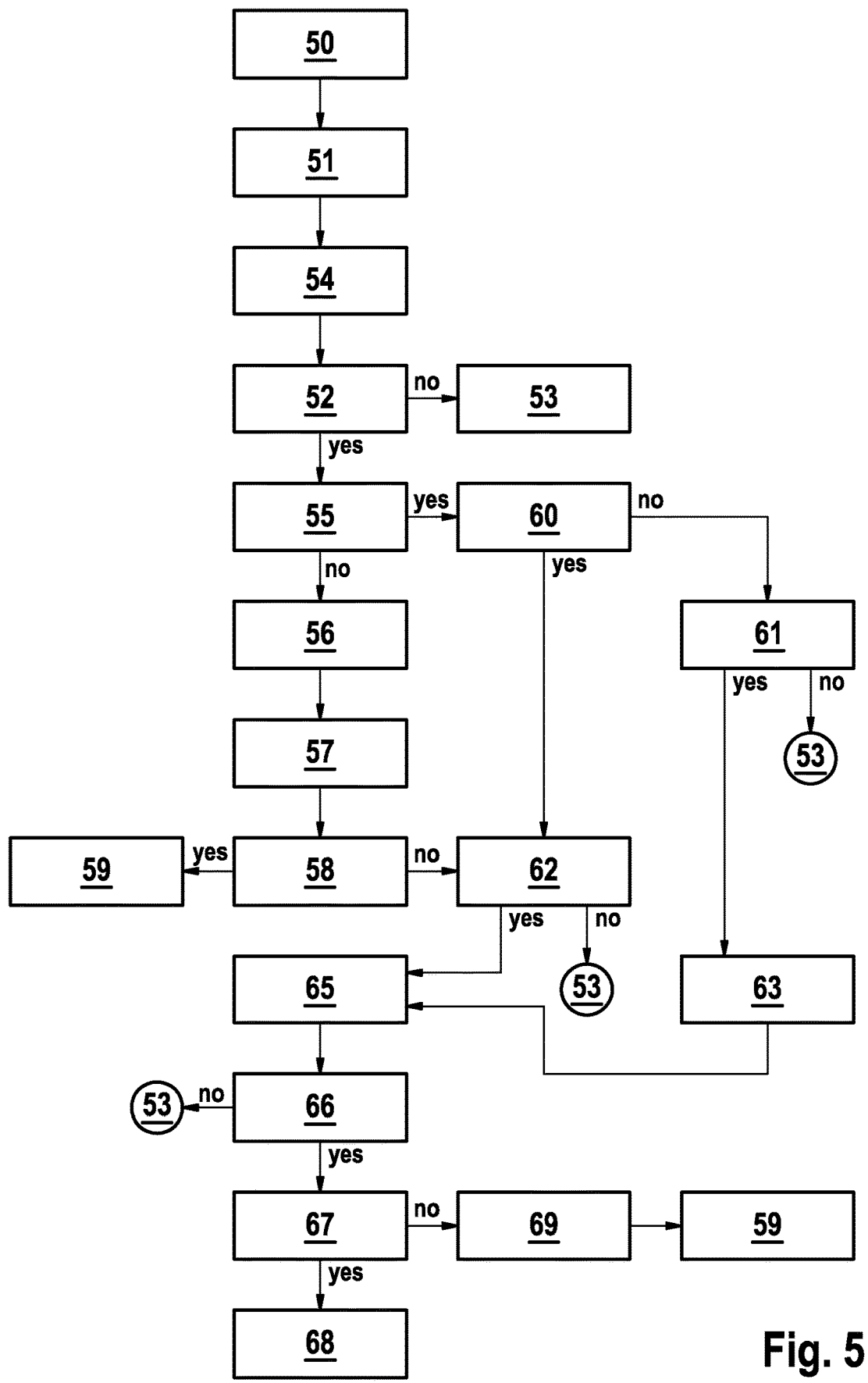
FIG. 5 shows a functional diagram for a fully automated mode.

In the fully automated mode as depicted in FIG. 5 the FIB Control 42 generally tries to maintain the ion current within a predefined range, the second range, for example for a target current value of 2 µA within the range 1.8 µA to 2.2 µA. The values for this second range can be either predefined by the FIB Control 42 or can be defined manually by the user of the system via the user interface (GUI) 45. The actual ion current is continuously measured and compared to the target value and the voltage supplied to the suppressor electrode is adjusted within an also predefined voltage range (first range) to maintain the ion current within the predefined second range. If it is identified in step 50 that the ion current runs out of its second range and in step 51 that the suppressor voltage reaches a limit of the first range of allowed suppressor voltages, the ion source FIB Recovery-Control 42 sends an information to the client that the sample processing needs to be interrupted and the milling run is stopped in step 54. The procedure checks in a step 52 whether the user has allowed an automatic heating process by his settings in the GUI 45. If the user did not allow such automatic heating process for the tip, the FIB is switched In a step 50 the actual ion current is continuously measured and compared to the target value and the voltage supplied to the suppressor electrode is adjusted within an also predefined voltage range (first range) to maintain the ion current within the predefined second range. If it is identified in step 50 that the ion current runs out of its second range and in step 51 that the suppressor voltage reaches a limit of the first range of allowed suppressor voltages, the ion source FIB Recovery-Control 42 sends an information to the client that the sample processing needs to be interrupted and the milling run is stopped in step 54. The procedure checks in a step 52 whether the user has allowed an automatic heating process by his settings in the GUI 45. If the user did not allow such automatic heating process for the tip, the FIB is switched either into a stand-by mode by reducing the extraction voltage well below the ionization threshold or by switching-off all voltage supplies 31-36 in a step 53. If an automatic heating process is allowed in a step 54 a message is sent to the client that sample processing needs to be interrupted.

In a following step 55 the FIB Recovery-Control 42 determines the number of heating processes of the tip conducted within the preceding predefined second time period. This predefined second time period can be, for example 12 to 24 hours, or even longer such as 36 hours. If the number of heating processes within this second time period is smaller than the predefined number, such predefined number can be for example between one and three, in a step 56 a heating process is started. If desired, this heating process also can be repeated several times with different heating currents.

After heating the tip of the ion source the extractor voltage is set to its earlier voltage setting or a slightly higher voltage in a step 57 until ion emission appears, and in a step 58 FIB Recovery-Control 42 checks whether the recovery process was successful, i.e. whether an ion current within the second predefined range is provided with a suppressor voltage which is reasonably far away from the limits of the first predefined range. If this is the case the FIB Recovery-Control 43 sends a respective information to the client in a step 59 that the sample processing can be continued.

If in step 58 it is determined that the recovery process has not been successful the process will be continued with a step 62 in which it is checked whether an adjustment of the extractor voltage is allowed. If the user has allowed such automatic adjustment by his setting in user interface 45, the extractor voltage is increased automatically by FIB Recovery Control 43 until a sufficiently high ion current is detected. If the user did not allow an automatic adjustment of the extractor voltage the process continues again with step 53, i.e. the FIB Recovery-Control 43 switches the FIB either into the stand-by mode by reducing the extractor voltage well below the ionization threshold or by switching-off all voltage supplies 31-36. If the user did allow an automated adjustment of the extraction voltage the extraction voltage is increased temporally in a step 65 until ion emission is achieved. And thereafter the extractor and suppressor voltages are adjusted until the ion current is within the second predefined range. In a successive step 66 FIB Control 43 determines whether the ion source has been turned-on successfully, i.e. whether an ion current within the second predefined range is achieved with a suppressor voltage which is reasonably far away from the limits of the first predefined range. If this is not the case FIB Control 45 continues again with step 53, i.e. the FIB Recovery-Control 43 switches the FIB either into the stand-by mode by reducing the extractor voltage well below the ionization threshold or by switching-off all voltage supplies 31-36.

If in step 66 it is confirmed that the ion source emits an ion current within the second predefined range with a suppressor voltage which is reasonably far away from the limits of the first predefined range, in a following step 67 it is analyzed whether the change of the extractor voltage was outside the allowed range according to the settings of the user in user interface 45. If this is the case in a step 68 FIB Recovery Control 43 waits for a predefined period of time and thereafter goes to step 53, i.e. switches the ion source either into the stand-by mode by reducing the extraction voltage well below the ionization threshold or by switching-off all voltage supplies 31-36. If in step 67 it is found that the change of the extractor voltages was not outside the allowed limit FIB Recovery Control 43 provides an information to the client 44 that the sample processing can be continued and continues the sample processing in step 59 as described above.

It should be noted here that in the case that the extractor voltage has been adjusted, i.e. changed to a voltage which is different to the voltage before the adjustment of the extractor voltage, it can become desirable to also adjust the voltages of high voltage source 34 to keep the probe current on the surface of the sample 6 constant. Also such adjustments of the other high voltage sources, alignment sources and switching of diaphragms can be performed by FIB Recovery Control 43 automatically.

If in step 55 it is found that the number of allowed heating processes within the second time period already is reached or exceeded FIB Recovery Control 43 checks in a step 60 whether a heating process was performed within the first predefined time period. The first predefined time period is smaller than the second predefined time period and can be for example in the range of 1 hour to 8 hours. If already a heating has been performed within the first time period FIB Recovery Control 43 checks in step 62 whether the user has allowed an adjustment of the extractor voltage by his respective setting in user interface 45. If the user has checked the respective box in user interface 45 to allow an adjustment of the extraction voltage the process will be continued with step 65 as already described above. If, however the user did not check the respective box in user interface 45, he does not allow an automatic adjustment of extraction voltage, FIB Recovery Controls 43 again goes to step 53, i.e. the FIB Recovery-Control 43 switches the FIB either into the stand-by mode by reducing the extraction voltage well below the ionization threshold or by switching-off all voltage supplies 31-36.

If in step 60 it is noted that no heating process was performed within the first period of time FIB Recovery Control 43 again checks in step 61 whether the user has allowed an automatic adjustment of the extractor voltage by checking the respective check box in user interface 45. If this is not the case the FIB Recovery Controls 43 again goes to step 53, i.e. the FIB Recovery-Control 43 switches the FIB either into the stand-by mode by reducing the extractor voltage well below the ionization threshold or by switching-off all voltage supplies 31-36. If the user does allow an automated adjustment of the extractor voltage FIB Recovery Control 43 continues with a heating step 63 and thereafter continues with step 65 already described above in which the extractor voltage is increased. Thereafter the steps 66 to 69 including step 59 are performed in the same manner as described above.

In a slightly modified embodiment between steps 54 and step 52 there can be provided a variable waiting period (of up to some hours) with an additional control of the ion current and the suppressor voltage. If the ion current and the suppressor voltage are within the normal operating ranges the processing will be restarted immediately, i.e. without conducting any source recovery process. If in contrast also after this waiting time the ion current still is out of the second predefined range with the suppressor at one of the limits of the first range, the process will be continued with step 52.

Figure 6:
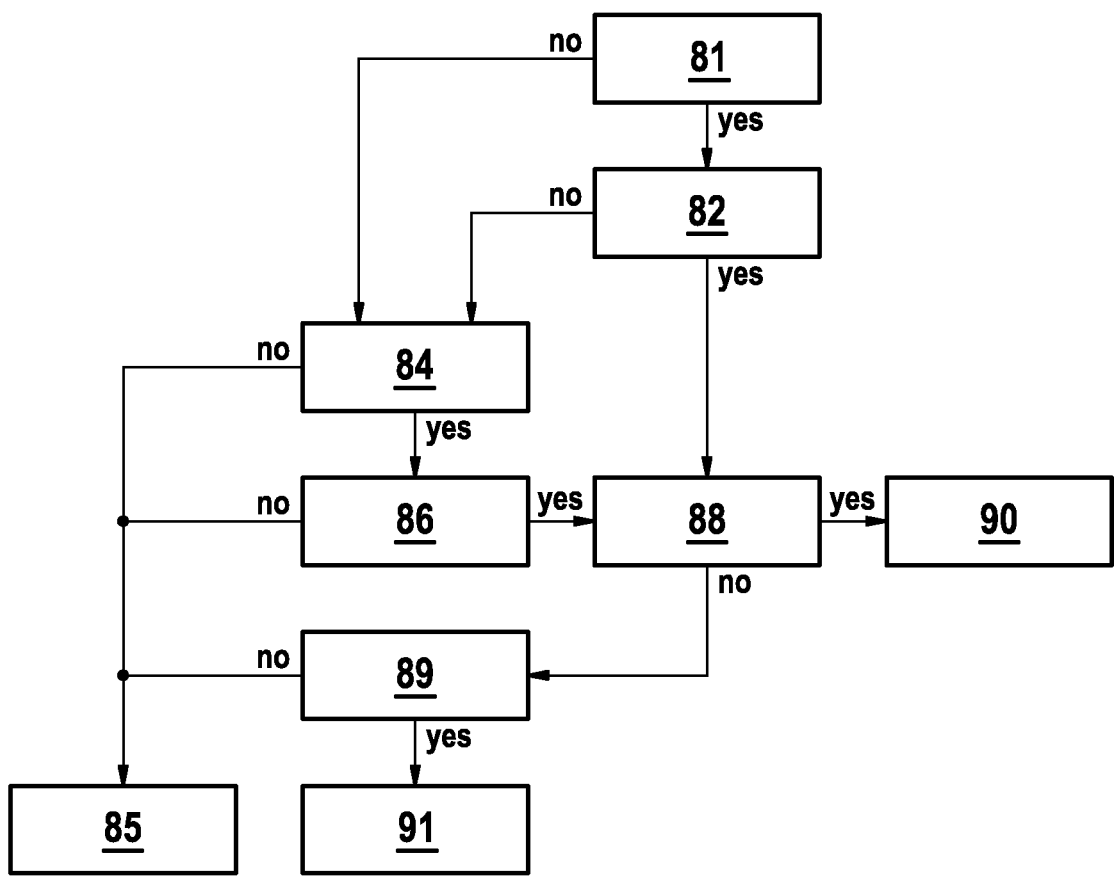
FIG. 6 shows a functional diagram for a semi-automated mode.

The process for the semi-automated mode is shown in FIG. 6. Also in the semi-automated mode FIB Recovery Control 43 continuously measures the ion current and concurrently the actual voltage of the suppressor electrode. In a step 81 the FIB Recovery Control 43 checks whether the user has checked the respective checkbox in user interface 45 that he wants to get a warning if the Recovery Control 43 detects that the suppressor voltage is close to the limit values predefined by the user in user interface 45. If this is not the case the process continues with a step 84 which will become described later in more detail. If the user has checked in user interface 45 that he wants to get a warning when the suppressor voltage gets to the predefined limit values and in a step 82 such event is not detected the process again continues with step 84. If in step 82 the event is detected that the suppressor voltage gets close to its limit values in a step 88 a respective message is generated and sent to the user interface 45 and the user is asked whether he wants to perform a recovery process (e.g. heating) of the tip of the ion source.

If the user either does not want to get a warning if the suppressor voltage gets close to its limits or no such event is detected, in a step 84 FIB Recovery Control 43 checks whether the user has checked the respective box to get a warning if the ion current gets out of its predefined range. If the user did not check the respective box the process is at its end 85 and nothing will happen. If the user has checked the respective box to get an information that the emission currents gets out of its predefined range and in a step 86 a respective event is detected, the FIB Recovery Control 43 again in a step 88 generates a respective message and sends it to user interface 45 with the question whether the user wants to perform a heating process. Otherwise, if the ion current does not get out of its predefined range, the process again is at its end 85 and nothing will happen which means that the user can continue to process the sample.

If in a step 88 the user indicates that he wants to perform a heating process FIB Recovery Control 43 initiates a respective process in a step 90 as it will be described in more detail with reference to FIG. 7. If the user indicates in step 88 that he does not want to perform a heating process of the tip of the ion source in a step 89 FIB Recovery Control 43 identifies whether the ion current either gets below a predefined value or gets above an upper limit value. As long as this is not the case nothing will happen and the process is at its end 85 again which means that the user can continue to process the sample. However in the case that a respective event is detected the FIB Recovery Control 43 in a step 91 either switches the ion source into its standby mode or turns it completely off as described above with respect to the fully automated mode.

Figure 7:
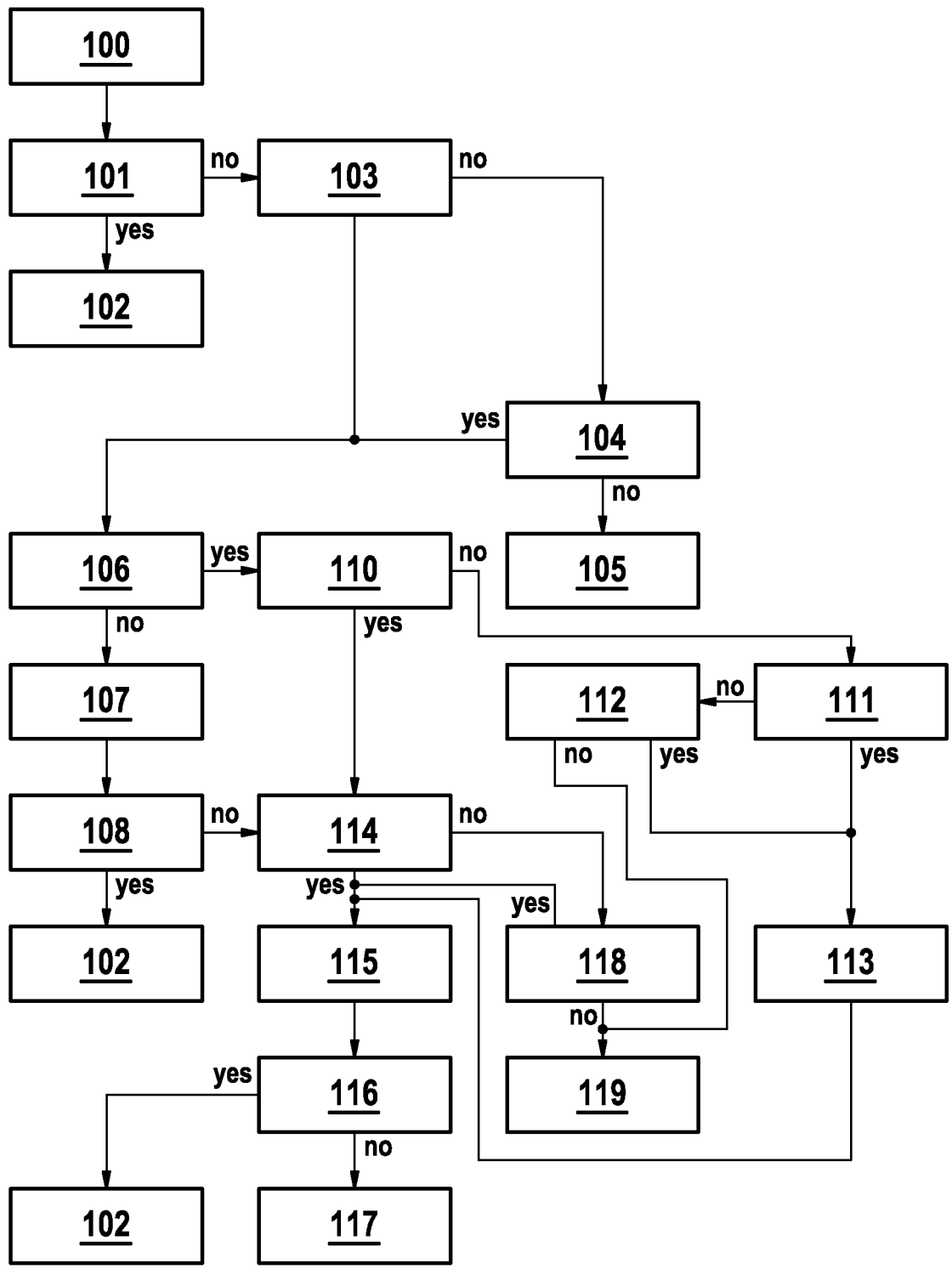

FIG. 7 depicts the process for turning on the ion source. After the user has pressed a button in step 100 in a step 101 it is decided whether the ion source operates in a proper regular state, i.e. the ion current is within the first predefined range and the suppressor voltage is in the second predefined range. If this is the case the process is at its end 102 and the user can start to process his sample as desired.

If in Step 101 it is detected that the ion source does not operate in a proper regular state in a step 103 it is checked whether the user has checked the box in the user interface 45 that an automated heating process is allowed to be performed. If the user did not select this option in a step 104 the user is asked via the user interface 45 whether he wants to have performed a heating. If he rejects this option in a step 105 a message is generated and sent to the user interface 45 that the turn-on of the ion source has failed and heating of the source needs to be started from an extra dialog.

If the user has either selected that an automated heating is allowed to be performed or that he has allowed this in step 104 in a next following step 106 the FIB Recovery Control 43 determines whether the number of heating processes of the tip conducted within the preceding predefined second time period has been exceeded. This predefined second time period can be, for example 12 to 24 hours, or even longer such as 36 hours. If the number of heating processes within this second time period is smaller than the predefined number, such predefined number can be for example between one and three, in a step 107 a heating process is performed. In consecutive step 108 the ion source is turned on again by applying the appropriate voltage to the electrodes 20 to 23 and it is decided whether the ion source operates in a proper regular state, i.e. the ion current is within the first predefined range and the suppressor voltage is in the second predefined range. If this is the case the process is at its end 102 and the user can start to process his sample as desired.

If in step 108 it is decided that the ion source still does not run in the regular state the process will be continued with a step 114 in which it is checked whether the user has allowed an adjustment of the extractor voltage by checking the respective checkbox in the user interface 45.

If in step 106 the FIB Recovery Control 43 determines that the number of allowed heating processes within the preceding second time period already is reached or exceeded in a consecutive step 110 it is determines whether at least one heating process was performed within the preceding first time period. If this also is the case the process again continues with step 114. If in step 110 it is determined that no heating was performed in the preceding first time period FIB Recovery Control 45 checks in a step 111 whether the user has checked in user interface 45 that the extraction voltage can be adjusted automatically. If the user did not check the respective check box in the user interface 45 in a step 112 the user is asked whether he wants to allow such adjustment of the extraction voltage now. If the user rejects such adjustment of the extraction voltage the process goes to step 119 and generates and sends to the user interface 45 a respective message.

If in step 112 the user has allowed an adjustment of the extraction voltage or he already had allowed this before the process continues with a heating process of the tip of the ion source in step 113. Thereafter the process continues with step 115 in which the extractor voltage is adjusted. Thereafter the process continues with step 116. It could be mentioned here that if 116 is successful, and the extractor voltage change is larger than a predefined amount, probe adjustment (automated or manual) may occur or be desirable.

If in step 114 it is identified that the user did not already allow an automated adjustment of the extraction voltage he is asked again in a step 118 whether he wants to allow this now. If he confirms to allow an adjustment of the extraction voltage the process continues with step 115 as described above. Otherwise the process continues with step 119 also already described above.

Figure 8:
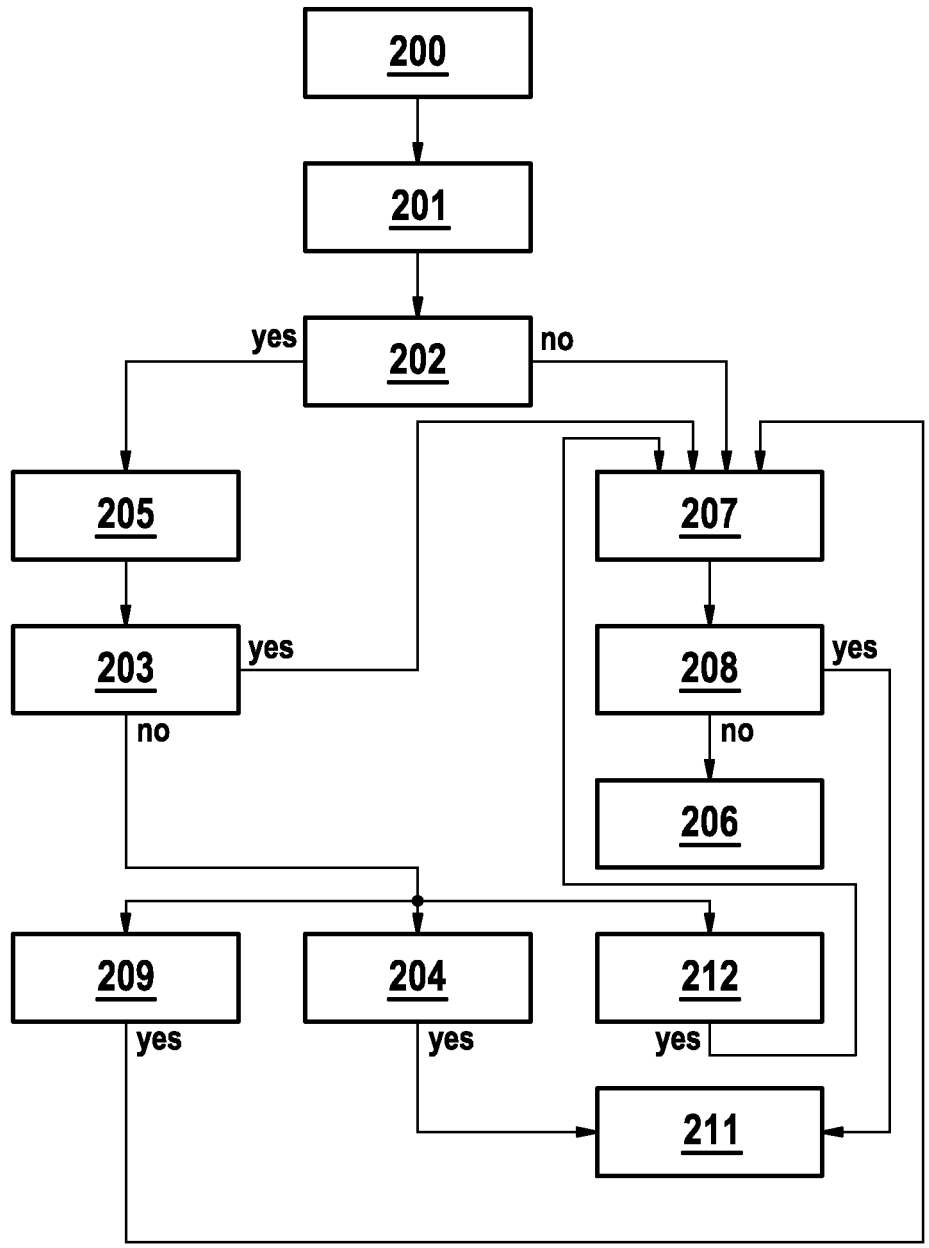
FIG. 8 shows a functional diagram for managing emission instabilities in a fully automated mode.

FIG. 8 shows the process if the ion current during operation in the fully automated mode shows emission instabilities, e.g. instable emission for some time, cease of the emission or the emission current drops to a very low current or increases above a critical value. If such an event is detected in a step 200 the FIB Recovery Control 43 sends a respective information to the client and interrupts, as fast as possible, the processing of the sample in a step 201. In step 202 FIB Recovery Control 43 determines whether the suppressor voltage is within the first predefined range. If this is the case, in step 205 it is waited for a predefined fourth waiting time, for example three seconds. If then in a step 203 it is noted that the ion current is not above a critical value FIB Recovery Control 43 controls whether the emission current can be restored within a fifth period of time.

This fifth period of time can e.g. be in the range between 15 seconds and one minute. If within this fifth period of time the ion current is within the second predefined range (step 204), the sample processing will be continued in a step 211. If within the fifth period of time in a step 209 the suppressor voltage is outside the limit of the first predefined range FIB Recover Control will continue with step 207 and a normal turn on process is tried. If in a step 208 it is identified that the turn-on in step 207 was successful sample processing will be continued in step 211. If the turn on process of step 207 is not successful, in step 206 a recovery process is done as described above with reference to FIG. 5 starting with step 52. If after the third period of time the emission is not restored and the suppressor is not at the limit of the first predefined range, the process is continued with step 207, as described above. In another embodiment, if after the third period of time the emission is restored and the suppressor is not at the limit of the first predefined range, it can also be implemented that the system waits until the emission is ok and the run can be continued or until the suppressor is outside the first predefined range and only then the recovery process starting with step 207 is done. If in step 203 it is noted that the ion current exceeds a critical value or in step 202 it is determined that the suppressor is not within the first predefined range, also here the process continues with step 207.

Figure 9:
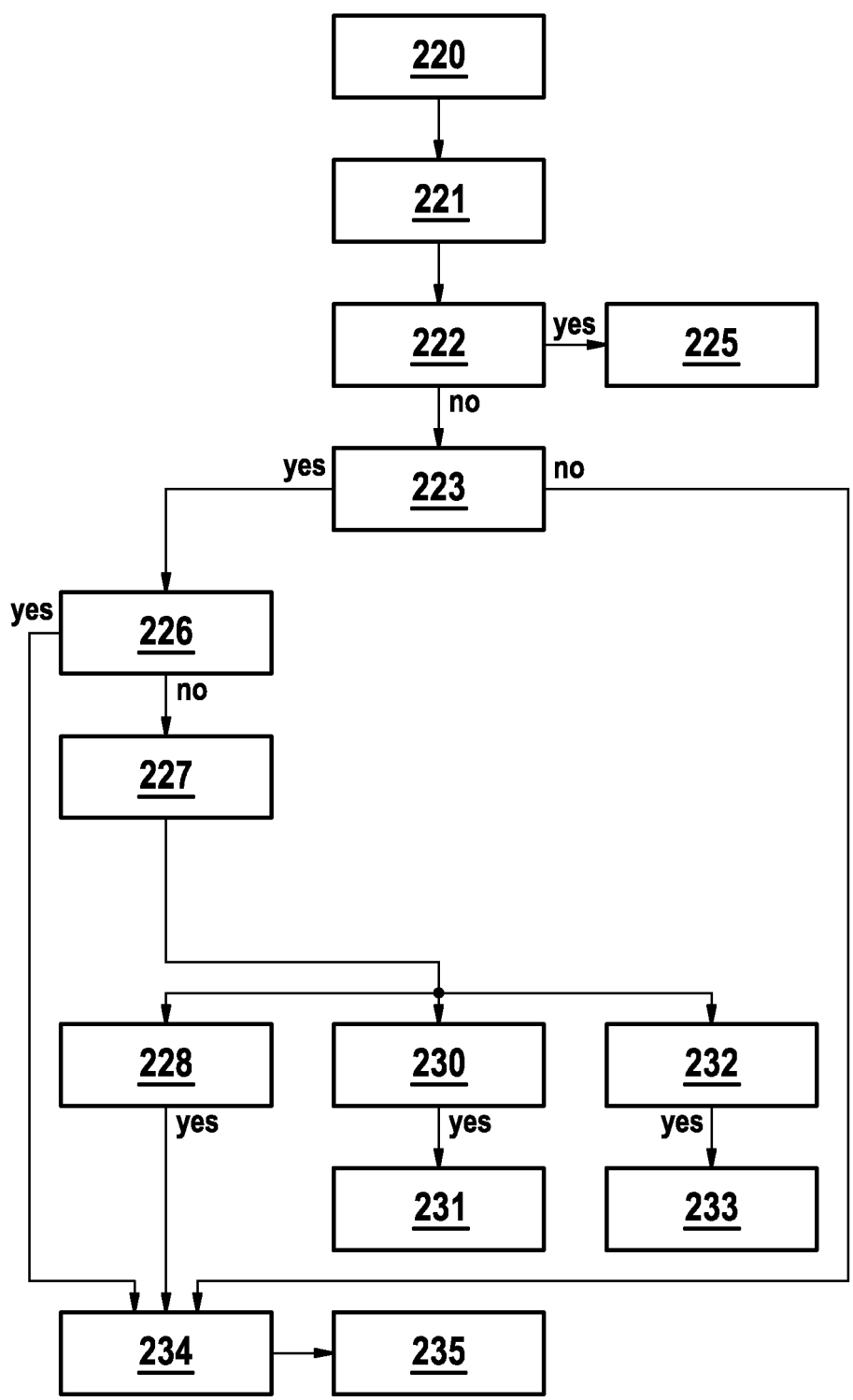
FIG. 9 shows a functional diagram for managing emission instabilities in a semi-automated mode

FIG. 9 shows the process if the ion current during operation in the semi-automated mode shows emission instabilities. If such an event is detected in a step 220, in a step 221 it is waited for a predefined fourth waiting time. If then in a step 222 it is noted that the emission current is within the second predefined range, nothing is done in a step 225. If in step 222 it is noted that the emission current is not within the second predefined range, FIB Recovery Control 43 determines in a step 223 if the suppressor voltage is within the first predefined range. If this is not the case, the source is switched into standby in step 234 and in step 235 the user is asked if emission recovery should be started. If the answer is no, nothing happens. If the answer is yes, a source turn on is tried first and if this is not successful emission recovery as described in FIG. 7 starting with step 106 is done. If in step 223 it is determined that the suppressor is within the first predefined range and in a step 226 it is determined that the emission is above a critical value, in step 234 the source is switched into standby and the process is continued in step 235 as described above. If in step 226 it is noted that the emission is not above a critical value, the user is informed in step 227 that he has to wait for up to a fifth predefined waiting time. If within the fifth waiting time the suppressor is outside the first predefined range in step 228, the source is switched into standby in step 234 and the user is asked in step 235 if emission recovery should be started, as described above. If in step 230 it is detected that within the fifth waiting time the emission current is within the second predefined range, the user is informed in a step 231 that everything is ok and work can be continued. If after the fifth period of time the emission is not restored and the suppressor is not at the limit of the first predefined range, in a step 233 the user is informed that emission will be ok soon. In another embodiment, if after the fifth period of time the emission is not restored and the suppressor is not at the limit of the first predefined range, it can also be waited until any of the requirements needed to start a process as described in FIG. 6 is fulfilled and the respective process can be started.

1 charged particle beam system
2 ion beam tube
3 electron beam tube 4 sample chamber
5 sample stage
6 sample
7 optical axis of ion beam tube
8 optical axis of electron beam tube
10 electron source
11 electrode
12 electrode
13 electrode
14 condenser lens
15 objective lens
16 scanning deflector
17 detector
18 detector within sample chamber
20 emitter tip
21 suppressor electrode
22 extraction electrode
23 condenser electrode
24 deflector electrode system
25 electrode
26 electrode
27 electrode
28 electrode
31 HV-Tip
32 HV-Sup
33 HV-Ext
34 HV-Cond
35 scan
36 HV-Obj
40 control
41 scan control
42 FIB control
43 FIB recovery control
44 client
45 GUI (graphical user interface)
50 Current out of range
51 Suppressor out of range
52 Auto-heating allowed
53 Switch off FIB
54 Stop milling
55 >N heatings in $2^{nd}$ time period
56 Heating
57 Turn on FIB
58 FIB turn on successful
59 Continue milling
60 Heatings in $1^{st}$ time period
61 Extractor adjustment allowed?
62 Extractor adjustment allowed?
63 Heating
65 Adjust extractor
66 Turn-on FIB
67 Extractor change>limit
68 Switch off FIB after period of time
69 Inform client
81 Is "Warn if suppressor close to limits" checked?
82 Is suppressor lower/higher than limits for heating warning?
84 Is "Warn if emission out of range" checked?
85 Do nothing
86 Emission out of range?
88 Do you want to recover source?
90 Start source recovery
91 Switch emission off
100 Turn off source
101 Source turn of successful?
102 Finish
103 Auto-heat checked?
104 Do you want to heat?
105 Turn on failed
106 Too many heats during second time period?
107 Heat
108 Heating process successful?
110 Last heat within first time period?
111 Auto extractor adjust checked?
112 Do you want to adjust extractor?
113 Heat
114 Auto extractor adjust checked?
115 Adjust extractor
116 Extractor adjust success?
117 Turn on failed
118 Do you want to adjust extractor?
119 Turn on failed
200 Detect emission instability
201 Interrupt run
202 Supp within first predefined range?
203 Emission above critical value?
204 Emission within $2^{nd}$ predefined range within $5^{th}$ period of time
205 Wait for $4^{th}$ predefined time
206 Start recovery process
207 Turn on source
208 Source turn on successful?
209 Supp outside $1^{st}$ predefined range within $5^{th}$ period of time
210 Wait until emission is within second predefined range
211 Continue run
212 209 or 204 not fulfilled within 5th period of time?
220 Detect emission instability
221 Wait for $4^{th}$ predefined time period
222 Emission within $2^{nd}$ range?
223 Suppressor within $1^{st}$ range?
225 Do nothing
226 Emission above critical value?
227 Inform user that he has to wait for up to a $5^{th}$ waiting time
228 Supp outside first predefined range within $5^{th}$ period of time?
230 Emission within $2^{nd}$ predefined range within $5^{th}$ period of time?
231 Inform user that everything is OK
232 228 or and? 230 not fulfilled within $5^{th}$ period of time?
233 Inform user that emission will be OK soon
234 Switch source to standby
235 Ask user if emission recovery should be started

What is claimed is:

1. A method for automated long term processing of a sample by a charged particle beam generated by a charged particle source, the charged particle source comprising a tip emitting charged particles, an extraction electrode and a suppressor electrode, a first variable voltage supply to bias the extraction electrode with an extraction voltage, and a second variable voltage supply to bias the suppressor electrode with a suppressor voltage, the method comprising:
   a) processing the sample by scanning a focused charged particle beam across the surface of the sample, the focused charged particle being produced by the charged particle source, the focused charged particle beam having a beam current;
   b) while processing the sample, measuring the beam current and the suppressor voltage;
   c) automatically adjusting the suppressor voltage within a first range to maintain the beam current within a second range;

d) automatically interrupting sample processing when the beam current is outside the second range because the suppressor voltage is close to a limit of the first range;
e) automatically carrying-out a source recovery process; and
f) automatically continuing sample processing after carrying-out the source recovery process.

2. The method of claim 1, wherein the charged particle source comprises an ion source, the beam current is an ion beam current, and the source recovery process comprises an ion source recovery process.

3. The method of claim 1, wherein the source recovery process comprises a heating process, and the method further comprises:
counting the number of heating processes conducted within a second time period; and
carrying-out a further heating process in e) when the number of heating processes performed within the second time period is less than or equal to a predefined number.

4. The method of claim 3, further comprising:
determining a time period lapsed since the last heating process has been performed; and
automatically changing the extraction voltage when either the time period is less than or equal to a predefined first time period or the number of heating processes performed within the second time period is greater than or equal to the predefined number.

5. The method of claim 3, further comprising:
determining a time period lapsed since the last heating process has been performed;
performing a further heating process when the time period lapsed since the last heating process is greater than a predefined first time period; and
changing the extraction voltage.

6. The method of claim 2, wherein the source recovery process comprises changing the extraction voltage, and the method further comprises:
determining an amount of change of the extraction voltage; and
continuing the processing of the sample when the amount of change of the extraction voltage is less than a predefined voltage value.

7. The method of claim 2, wherein the source recovery process comprises changing the extraction voltage, and the method further comprises:
determining an amount of change of the extraction voltage; and
automatically realigning a focus of the ion beam and/or a current of the ion beam on a surface of a sample when the amount of change of the extraction voltage is greater than a predefined voltage value.

8. A charged particle beam system, comprising:
a tip configured to emit charged particles;
an extraction electrode;
a suppressor electrode;
a first variable voltage supply configured to bias the extraction electrode with an extraction voltage;
a second variable voltage supply configured to bias the suppressor electrode with a suppressor voltage; and
a controller configured to:
process a sample by scanning a charged particle beam emitted by the tip across a surface of the sample, the charged particle beam having an emission current;
measure the emission current and the suppressor voltage while processing the sample;
automatically adjust the suppressor voltage within a first range to maintain the emission current within a second range;
automatically interrupt the sample processing when the emission current gets out of the second range because the suppressor voltage is close to a limit of the first range;
automatically perform a source recovery process; and
automatically continue the sample processing after performing the source recovery process.

9. The charged particle beam system of claim 8, wherein the charged particle source comprises an ion source, the beam current comprises an ion beam current, and the source recovery process comprises an ion source recovery process.

10. The charged particle beam system of claim 8, wherein:
the source recovery process comprises a heating process; and
the controller is configured to:
count the number of heating processes conducted within a second time period; and
perform a further heating process when the number of heating processes performed within the second time period is less than or equal to a predefined number.

11. The charged particle beam system of claim 10, wherein the controller is configured to automatically change the extraction voltage when the number of heating processes performed within the second time period is greater than or equal to the predefined number.

12. The charged particle beam system of claim 11, wherein the controller is configured to:
determine a time period since a last heating process was carried out; and
perform a further heating process when the time period is larger than a predefined time period.

13. The charged particle beam system of claim 11, wherein the controller is configured to:
determine an amount of change of the extraction voltage; and
automatically continue the sample processing when the amount of change of the extraction voltage is less than a predefined voltage value.

14. The charged particle beam system of claim 11, wherein the controller is configured to:
determine an amount of change of the extraction voltage; and
automatically realign a focus of the charged particle beam and/or a current of the charged particle beam on a surface of a sample when the amount of change of the extraction voltage is greater than a predefined voltage value.

15. The charged particle beam system of claim 8, wherein the controller is configured to:
receive commands relating to an application from a client;
automatically switch into a fully automated mode while the application is running;
automatically switch into a semi-automated mode when the application has been completed; and
perform the source recovery process in the fully automated mode.

16. The charged particle beam system of claim 8, further comprising a user interface configured to allow a user of the charged particle beam system to select the second range.

17. The charged particle beam system of claim 16, wherein:
the user interface is configured to allow the user of the charged particle beam system to select a predefined voltage value; and the controller is configured to automatically continue the sample processing when an amount of change of the extraction voltage is less than the predefined voltage value.

18. The charged particle beam system of claim 16, wherein the user interface is configured to select whether an automated heating process will be performed.

19. The charged particle beam system claim 16, wherein the user interface is configured to select whether an automated change of the extraction voltage will be performed.

20. The charged particle beam system of claim 16, wherein the user interface is configured to allow the user of the charged particle beam system to select between a fully automated mode and a semi-automated mode, and wherein the control is further to carry-out the source recovery process in the fully automated mode.

21. The charged particle beam system of claim 16, wherein the user interface is configured to allow the user of the charged particle beam system to select:
whether an automated heating process will be performed; and
the first range.

22. The charged particle beam system of claim 16, wherein:
the user interface is configured to allow the user of the charged particle beam system to select whether an automated heating process will be performed;

the controller is configured to interrupt the sample processing for an waiting time period before the source recovery process is started; and
the user interface is configured to allow the user of the charged particle beam system to select the waiting time period.

23. The charged particle beam system of claim 16, wherein the controller is configured to:
determine whether within the waiting time period the emission current is within the second range and the suppressor voltage is within the first range; and
continue the processing without carrying-out the source recovery process when the emission current is determined to be within the second range and the suppressor voltage is identified to be within the first range.

24. The charged particle beam system of claim 16, wherein:
the user interface is configured to allow the user of the charged particle beam system to select a predefined voltage value; and
the controller is configured to automatically realign a focus of the charged particle beam and/or a current of the charged particle beam on a surface of a sample when an amount of change of the extraction voltage is greater than the predefined voltage value.

\* \* \* \* \*

UNITED STATES PATENT AND TRADEMARK OFFICE
CERTIFICATE OF CORRECTION

PATENT NO. : 10,854,421 B2
APPLICATION NO. : 16/429315
DATED : December 1, 2020
INVENTOR(S) : Daniela Donhauser et al.

Page 1 of 1

It is certified that error appears in the above-identified patent and that said Letters Patent is hereby corrected as shown below:

In the Specification

Column 5, Line 2, delete "mode" and insert -- mode. --;

Column 9, Line 51, delete "switched" and insert -- switched. --;

Column 12, Line 44, delete "mode" and insert -- mode. --;

In the Claims

Column 16, Line 60, Claim 1, after "particle" insert -- beam --;

Column 19, Line 8, Claim 19, after "system" insert -- of --.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*